United States Patent
Hori et al.

[11] Patent Number: 5,731,637
[45] Date of Patent: Mar. 24, 1998

[54] SEMICONDUCTOR DEVICE

[75] Inventors: Shizue Hori; Akihiko Osawa, both of Tokyo; Yoshiro Baba; Shigeo Yawata, both of Yokohama, all of Japan

[73] Assignee: Kabushiki Kaisha Toshiba, Kawasaki, Japan

[21] Appl. No.: 687,032

[22] Filed: Jul. 25, 1996

[30] Foreign Application Priority Data

Jul. 28, 1995 [JP] Japan .................. 7-193022

[51] Int. Cl.⁶ .................. H01L 23/58
[52] U.S. Cl. .................. 257/913; 257/611; 257/617; 438/479
[58] Field of Search .................. 257/607, 610, 257/611, 612, 617, 913; 438/473, 474, 475

[56] References Cited

U.S. PATENT DOCUMENTS

| | | |
|---|---|---|
| 4,216,030 | 8/1980 | Graul et al. .................. 257/617 |
| 4,291,329 | 9/1981 | Hanes et al. .................. 257/617 |

*Primary Examiner*—Mark V. Prenty
*Attorney, Agent, or Firm*—Finnegan, Henderson, Farabow, Garrett & Dunner, L.L.P.

[57] ABSTRACT

The object of the present invention is to provide a method of manufacturing high-performance, high-breakdown-voltage semiconductor devices which suppresses an increase in the junction leakage current due to heavy metal contamination without increasing the number of manufacturing steps. A method of manufacturing semiconductor devices according to the invention, comprises the steps of ion-implanting one or more elements selected from a group of silicon, carbon, nitrogen, oxygen, hydrogen, argon, helium, and xenon into at least one surface of a semiconductor substrate of a first conductivity type at a dose of $1\times10^{15}$ cm$^{-2}$ or more to form a distortion layer, oxidizing the surface of the substrate to form an oxide film, ion-implanting impurities of a second conductivity type at a low concentration (a dose of less than $1\times10^{15}$ cm$^{-2}$) via the oxide film into the one surface of the substrate, ion-implanting impurities of the second conductivity type at a high concentration (a dose of $1\times10^{15}$ cm$^{-2}$ or more) via the oxide film into the other surface of the substrate, and forming a junction by heat treatment.

4 Claims, 7 Drawing Sheets

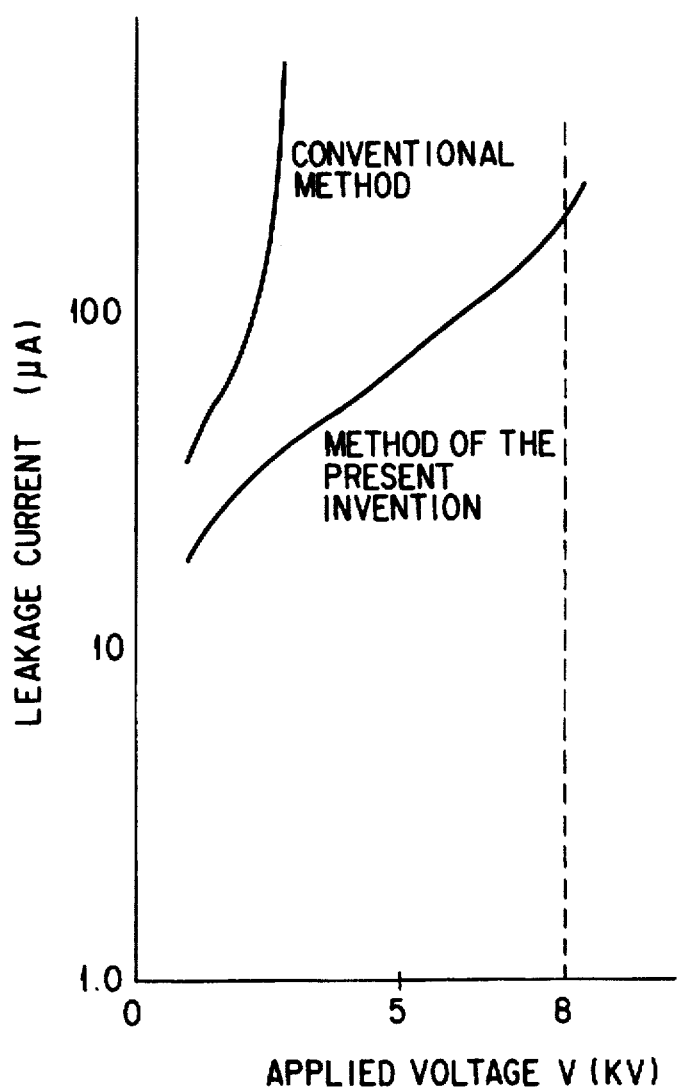
F I G. 9

– 5,731,637 –

SEMICONDUCTOR DEVICE

BACKGROUND OF THE INVENTION

1. Field of the Invention

This invention relates to a semiconductor device, and more particularly to gettering in a high-breakdown-voltage semiconductor device.

2. Description of the Related Art

To manufacture a thyristor as shown in FIG. 1, for example, p-type impurity ions are implanted into both surfaces of an n-type substrate 110 and then diffused by heat treatment to form p-type diffused layer regions 113 and 114. An n-type diffused layer 118 is formed at the surface of one region, on which an Al electrode 119 is further formed. In the case of such a device, the p-type region 113 must be a low-concentration diffused layer in order to optimize the on voltage of the thyristor for the purpose of improving the gate sensitivity of the Al electrode provided on the p-type region 113.

FIG. 2A shows the manufacturing steps of a conventional p-n-p structure. First, an n-type silicon substrate is subjected to thermal oxidation, and then to implant low-concentration ions into one surface of the substrate and high-concentration ions into the other surface of the substrate, followed by heat treatment, which forms p-type diffused layers at both surfaces. The concentration profile for the depth from the top surface of the substrate is shown in FIG. 2B. In the figure, the low-concentration p-type diffused layer 113 is formed at the top surface of the substrate and the high-concentration p-type diffused layer 114 is formed at the bottom surface of the substrate. P-n junctions are formed between each of these layers and the n-type substrate. The concentration of each diffused layer and the depth of its junction are controlled by the dose of ions implanted, the acceleration voltage, and the temperature and time of heat treatment so as to meet the breakdown-voltage characteristics of the p-n-p structure.

The p-n-p structure thus produced had a problem: when junction leakage current was measured at each of the low-concentration diffused layer and high-concentration diffused layer, a large leakage current was measured especially at the low-concentration diffused layer, resulting in the insufficient breakdown characteristics. Normally, in a low-concentration diffused layer, a depletion layer generally extends more than in a high-concentration diffused layer, so that the electric field applied to the depletion layer decreases and therefore the junction breakdown voltage has a larger value. The above problem, however, presents the opposite result to the characteristics usually expected.

The cause of a drop in the junction breakdown voltage at the low-concentration diffused layer can be considered to be an increase in the leakage current resulting from layer faults and the insufficient gettering of heavy metals. Namely, in low-concentration ion implantation, a distortion layer whose concentration is high enough to collect harmful impurities cannot be formed by only ion implantation.

On the other hand, in high-concentration ion implantation, a sufficiently high concentration distortion layer is formed and heavy metals contributing to leakage current are absorbed by the gettering effect, resulting in a decrease in the junction leakage current. Therefore, it can be considered that the junction leakage current in the low-concentration diffused layer gets larger than in the high-concentration diffused layer, leading to a drop in the junction breakdown voltage.

To solve the above problem, there has been a manufacturing method shown in FIG. 3. Specifically, an n-type silicon substrate 110 is subjected to thermal oxidation and high-concentration ions are implanted into both surfaces of the substrate, followed by thermal treatment, which forms high-concentration p-type diffused layers 115 and 116. Thereafter, the surface of one region of the substrate is etched away until the concentration in one p-type diffused layer has reached a desired value. The concentration profile for the depth from the surface of the substrate at that time is shown in FIG. 3B. In the figure, the hatched portion 117 at the surface of the substrate is etched away to form a low-concentration p-type diffused layer 118 having a concentration profile similar to that in FIG. 2B. When each junction breakdown voltage in the p-n-p structure thus manufactured was measured, the measurements showed that the sufficient breakdown voltages were measured at both of the high-concentration and low-concentration layers.

With this method, however, the substrate surface must be etched away so that the desired diffused-layer concentration may be obtained after the formation of diffused layers. Thus, the addition of steps lowers the productivity and the controllability of the diffused-layer concentration by the etching away of the substrate surface is poorer than the controllability of the concentration by ion implantation followed by thermal treatment, resulting in the problem of being unable to get sufficient process margins. Furthermore, the manufacturing steps become more complex and the layers may be contaminated again with heavy metal when the surface layer is etched away.

SUMMARY OF THE INVENTION

With the conventional manufacturing method, when a low-concentration diffused layer is formed by low-concentration ion implantation, the breakdown voltage characteristic deteriorates because the gettering effect cannot be obtained sufficiently. Furthermore, when high-concentration ions are implanted into both surfaces of the substrate to form high-concentration diffused layers and then one surface of the substrate is etched away to form a low-concentration diffused layer, the addition of an etching-away step causes the problems of a decrease in the productivity, deterioration of the diffused-layer concentration controllability, and the possibility of recontamination by heavy metal.

The object of the present invention is to provide a high-performance, high-breakdown-voltage semiconductor device capable of suppressing an increase in the junction leakage current without increasing the number of steps or allowing heavy-metal contamination.

The foregoing object is accomplished by providing a method of manufacturing semiconductor devices, comprising: the step of ion-implanting one or more elements selected from a group of silicon, carbon, nitrogen, oxygen, hydrogen, argon, helium, and xenon into at least one surface of a semiconductor substrate of a first conductivity type at a dose of $1 \times 10^{15}$ cm$^{-2}$ or more; the step of oxidizing the surface of the substrate to form an oxide film; the step of ion-implanting impurities of a second conductivity type at a low concentration (a dose of less than $1 \times 10^{15}$ cm$^{-2}$) via the oxide film into the substrate surface into which the element has been implanted; the step of ion-implanting impurities of the second conductivity type at a high concentration (a dose of $1 \times 10^{15}$ cm$^{-2}$ or more) via the oxide film into the other surface of the substrate; and the step of forming a junction by heat treatment.

The foregoing object is also accomplished by providing a semiconductor device having two junctions between a semiconductor substrate of a first conductivity type and surface regions of a second conductivity type that are formed by ion-implanting impurities of the second conductivity type into both of the top and bottom surfaces of the substrate and heat-treating the surfaces, wherein one of the two surface regions of the second conductivity type has a high impurity concentration and the other has a low impurity concentration, and the low-impurity-concentration region includes a distortion layer formed by ion-implanting one or more elements selected from a group of silicon, carbon, nitrogen, oxygen, hydrogen, argon, helium, and xenon.

When the depth ($x_j$) of a junction from the substrate surface is great (10 μm or more), the end of a depletion layer (a depth of $x_p$) of the second conductivity type exists in a portion sufficiently deeper than the distortion layer (a depth of $s_d$) caused by a neutral element implantation. Furthermore, when the depth ($x_j$) of a junction from the substrate surface is small (10 μm or less), that is, when the distortion layer (a depth of $x_d$) by a neutral element implantation is close to the end of a depletion layer (a depth of $x_p$) of the second conductivity type, a high-concentration layer of the second conductivity type is formed locally near $x_j$ and the end of the depletion layer (a depth of $x_p$), the depth of the junction ($x_j$), and the impurity concentration c fulfill the following expression:

$$\int_{x_p}^{x_j} c\,dx > 2 \times 10^{12}\,\text{cm}^{-2}$$

With a method of manufacturing semiconductor devices according to the present invention, because a distortion layer is formed at a high concentration by ion-implanting an element, such as silicon, carbon, nitrogen, oxygen, hydrogen, argon, helium, or xenon, into a semiconductor substrate at a high concentration, the distortion layer is capable of collecting harmful impurities, including layer faults and heavy metals, sufficiently even in a region into which ion implantation is effected at a low impurity concentration. This helps reduce junction leakage current stemming from those heavy metals, making it possible to produce a semiconductor device having a sufficient breakdown voltage characteristic.

Furthermore, since gettering is done by ion-implanting a neutral element unrelated to the conductivity type, such as silicon, carbon, nitrogen, oxygen, hydrogen, argon, helium, or xenon, at a high concentration beforehand, it is possible to prevent an increase in the number of steps, the deterioration of controllability, and recontamination by heavy metal due to complicated steps, which were found in a conventional method where impurities were ion-implanted into both of the surfaces of a substrate at a high concentration for the purpose of gettering and one surface of the substrate was etched away to produce a suitable diffused layer concentration. In addition, because the amount of ions implanted for the formation of diffused layers can be set freely, regardless of the gettering effect, the optimum value necessary for the characteristic of the semiconductor device can be selected.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 9 shows the results of measuring the junction leakage current in a semiconductor device of the present invention.

DETAILED DESCRIPTION OF THE PREFERRED EMBODIMENTS

Hereinafter, using FIGS. 4A to 4E, embodiments of the present invention will be explained.

Figure 4A:
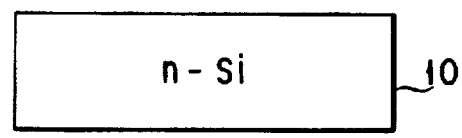
FIGS. 4A, 4B, 4C, 4D, and 4E are sectional views to help explain the steps of manufacturing semiconductor devices of the present invention.
Figure 4B:
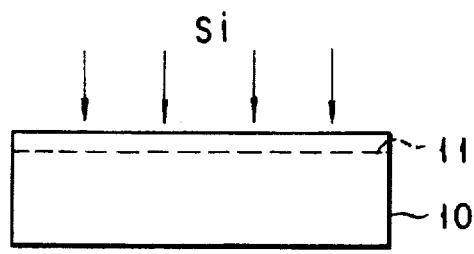

Silicon (Si) is implanted into one surface of an n-type silicon substrate 10 at a dose of $1 \times 10^{16}$ cm$^{-2}$ and an acceleration voltage of 50 keV and thereby a layer 11 having distortion caused by the implanted silicon is formed at a depth of about 70 nm from the surface (FIG. 4B).

Figure 4C:
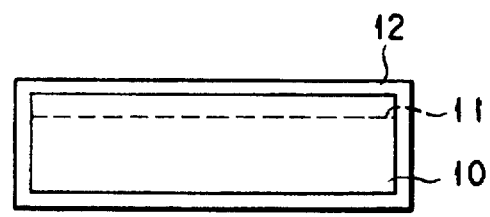

Next, to suppress damage to the surface of the substrate at the time of impurity ion implantation and prevent outward diffusion, a 75-nm-thick oxide film 12 is formed by thermal oxidation at 1000° C. (FIG. 4C).

Figure 4D:
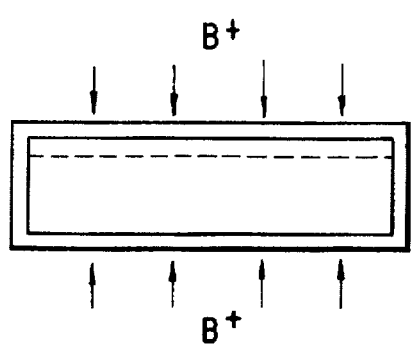
Figure 4E:
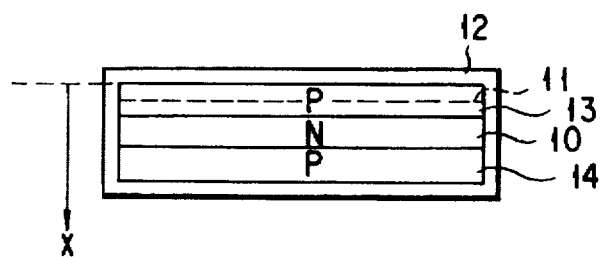

Thereafter, boron ions are implanted at a dose of $3.5 \times 10^{14}$ cm$^{-2}$ and an acceleration voltage of 50 keV into the surface at which the layer 11 having the distortion has been formed, and at a dose of $3 \times 10^{15}$ cm$^{-2}$ at an acceleration voltage of 50 keV into the opposite surface (FIG. 4D). Then, thermal treatment at more than 1200° C. for 90 hours is carried out to form a low-concentration diffused layer 13 and a high-concentration diffused layer 14, each of which has a junction depth ranging from 60 to 70 μm (FIG. 4E).

Figure 5:
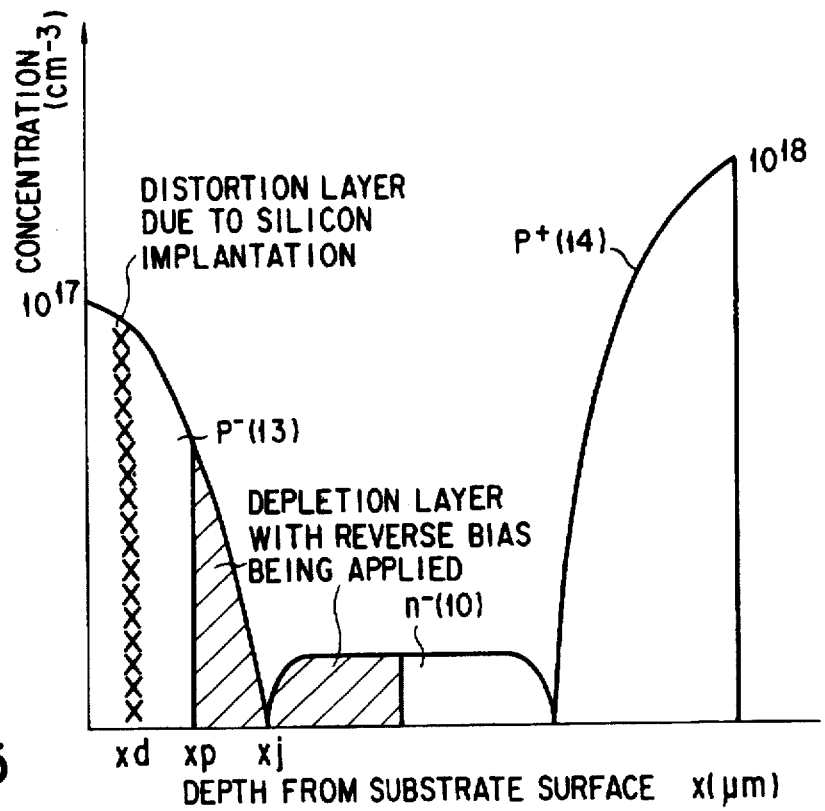
FIG. 5 is a concentration distribution diagram of impurities in the substrate depth direction in a semiconductor device of the present invention.

The concentration profile of the p-n-p structure completed by the above steps is shown in FIG. 5. FIG. 5 shows the impurity concentration in the depth direction with the substrate surface into which silicon has been implanted being the origin. The p-type low-concentration diffused layer 13 with a peak concentration of $1 \times 10^{17}$ cm$^{-3}$ forms a junction with the n-type substrate about 60 μm in depth at the top surface of the substrate and the p-type high-concentration diffused layer 14 with a peak concentration of $1\times10^{18}$ cm$^{-3}$ also forms a junction with the n-type substrate about 60 to 70 μm in depth at the bottom surface of the substrate. Furthermore, silicon is implanted into the top surface of the substrate to form a high-concentration distortion layer 11. The concentration of the distortion layer 11 is set by the dose in such silicon implantation as produces the gettering effect sufficiently. Therefore, the concentration of the low-concentration diffused layer 13 can be set freely by the dose in ion implantation so that the desirable characteristic of the semiconductor device can be obtained, regardless of the gettering effect. Gettering at the bottom surface of the substrate is sufficiently achieved in the high-concentration diffused layer 14. As for the depth direction, if the depletion layer end on the diffused layer 13 side (p-type layer) with a reverse bias being applied to the junction between the p-type low-concentration diffused layer 13 and the n-type substrate is $x_p$, the relationship between the distortion layer (a depth of $x_d$) caused by a neutral element implantation and the junction (a depth of $x_j$) between the p-type low-concentration diffused layer 13 and the n-type substrate fulfills $x_d < x_p < x_j$.

While in the above embodiment, the oxide film 12 is formed as a buffer film before ion implantation of boron, an oxide film may be formed as a buffer film before silicon implantation and then after silicon implantation, ion implantation of boron may be performed. This is a second embodiment of the present invention. In the second embodiment, if the flying distance of silicon atom is $R_p$ and its depth of dispersion is $\Delta R_p$, silicon must be implanted at an energy high enough to make $R_p - \Delta R_p$ larger than the thickness of the buffer oxide film. Since gettering is effected during the heat treatment for forming a diffused layer after boron implantation, the gettering effect is produced even though the oxide film forming process is carried out earlier.

Figure 6A:
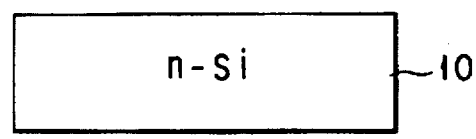
FIGS. 6A, 6B, 6C, 6D, and 6E are sectional views to help explain the steps of manufacturing semiconductor devices according to a third embodiment of the present invention.
Figure 6B:
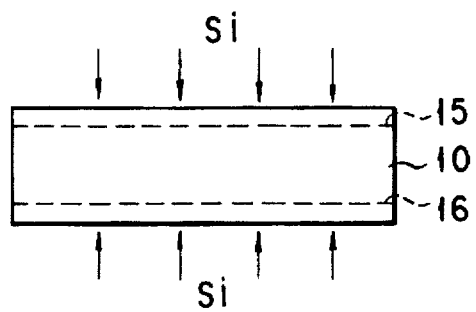

As a third embodiment of the invention, a method of manufacturing semiconductor devices which enables not only the concentration of a diffused layer to be set freely according to the characteristics of the semiconductor device but also the junction leakage current to be suppressed sufficiently, while assuring the gettering effect, will be explained by reference to FIGS. 6A to 6E. Specifically, silicon (Si) is implanted into both of the surfaces of an n-type silicon substrate 10 at a dose of $1\times10^{16}$ cm$^{-2}$ and an acceleration voltage of 50 keV and thereby distortion layers 15 and 16 are formed by the implanted silicon (FIG. 6B).

Figure 6C:
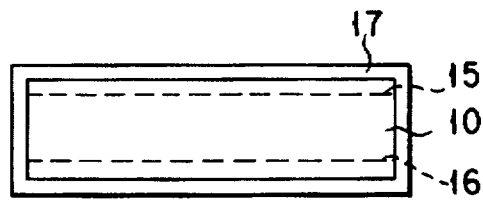

Next, gettering is effected by heat treatment at more than 1200° C. for 90 hours. Then, for example, a 75-nm-thick oxide film 17 is formed by thermal oxidation at 1000° C. (FIG. 6C).

Figure 6D:
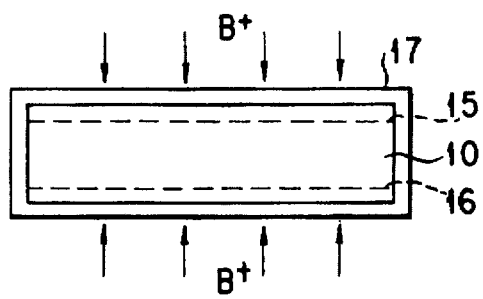
Figure 6E:
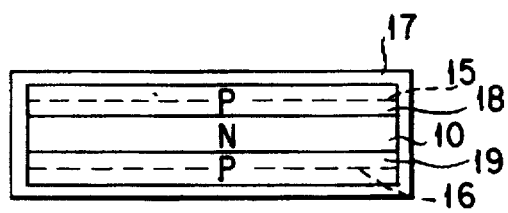

Thereafter, for example, boron is ion-implanted into one surface at a dose of $3.5\times10^{14}$ cm$^{-2}$ and an acceleration voltage of 50 keV and boron is ion-implanted into the other surface at a dose of $3.5\times10^{14}$ cm$^{-2}$ and an acceleration voltage of 50 keV (FIG. 6D). Then, a diffused layer 18 and a diffused layer 19 each having a desired junction depth are formed by suitable heat treatment (FIG. 6E).

With this embodiment, because silicon implantation for gettering is separated from the heat treatment step before the ion implantation and heat treatment for the formation of diffused layers, the step of forming diffused layers is not affected by the gettering step. Therefore, the concentration of diffused layers and junction depth required to obtain the desired characteristics of the semiconductor device can be set freely by the amount of ions implanted and subsequent heat treatment, making it possible to produce a higher-performance semiconductor device.

Figure 7:
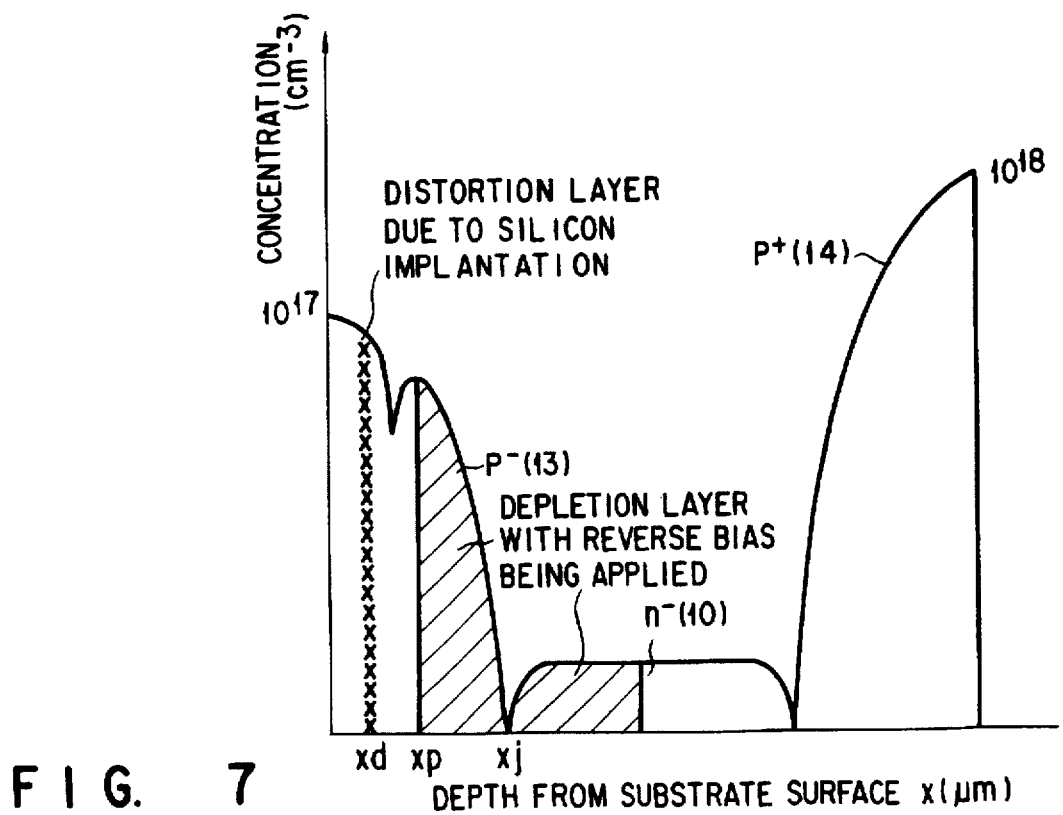
FIG. 7 is a concentration distribution diagram of impurities in the substrate depth direction in a semiconductor device of the present invention.

A fourth embodiment of the present invention is such that when the junction depth $x_j$ is particularly 10 μm or less and expression $x_d \leq x_p$ ($x_d$ is the depth of the distortion layer due to silicon implantation and $x_p$ is the depth of the depletion layer end at the substrate top surface with a reverse bias being applied to the junction) holds, another boron implantation at higher energy is effected during boron implantation into the surface into which silicon has been implanted, thereby forming a diffused layer. The concentration profile at that time is shown in FIG. 7. Since in the concentration profile, the boron concentration gets higher near the junction, this helps reduce the junction leakage current.

Figure 8A:
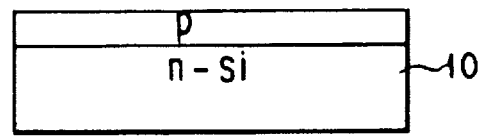
FIGS. 8A, 8B, 8C, 8D, and 8E are sectional views to help explain the steps of manufacturing semiconductor devices according to a fifth embodiment of the present invention.
Figure 8B:
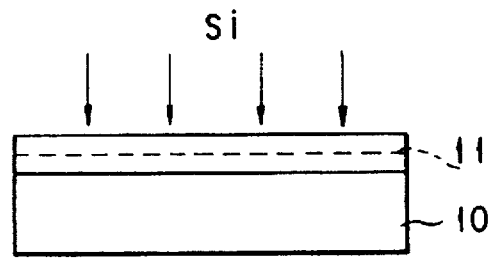
Figure 8C:
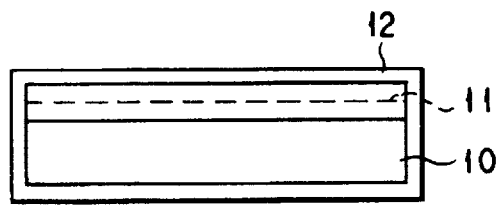
Figure 8D:
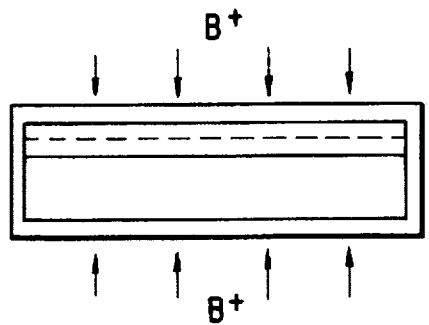
Figure 8E:
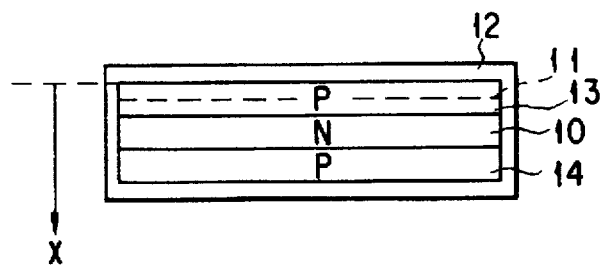

A fifth embodiment of the present invention is such that when the junction depth $x_j$ is particularly 10 μm or less and expression $x_d \leq x_p$ holds as in the fourth embodiment, an n-type substrate having a p-type epitaxial layer on it is used as a wafer and then silicon is implanted into the epitaxial layer to form a distortion layer as shown in FIG. 8B. After an oxide film is formed on it, boron implantation is carried out (FIGS. 8C, 8D, 8E) to produce a concentration profile as shown in FIG. 7. This embodiment produces the effect of increasing the boron concentration near the junction as in the third embodiment and thereby reducing the junction leakage current.

While in the above embodiments explained until now, silicon has been implanted for gettering, another element, such as carbon, nitrogen, oxygen, hydrogen, argon, helium, or xenon may be used. In the case of silicon, the gettering effect was observed when the acceleration voltage was 50 keV or higher and the dose was $5\times10^{15}$ cm$^{-2}$ or more. For example, in the case of xenon, experiments have shown that the implantation acceleration voltage must be 100 keV or higher and the dose be $1\times10^{16}$ cm$^{-2}$ or more. In this way, the acceleration voltage and dose most suitable for gettering must be selected element by element.

Furthermore, the methods of manufacturing semiconductor devices according the above embodiments may be applied to all of the semiconductor devices having a p-n-p structure, such as transistors and thyristors.

Figure 1:
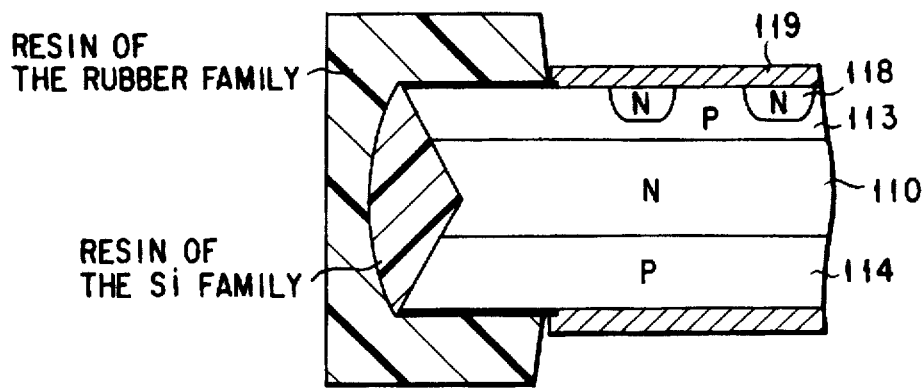
FIG. 1 is a sectional view of a structure of a conventional semiconductor device.
Figure 2A:
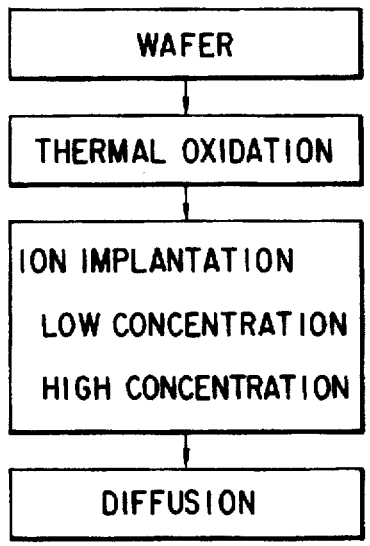
FIG. 2A shows the steps of manufacturing semiconductor devices by a conventional method.
Figure 2B:
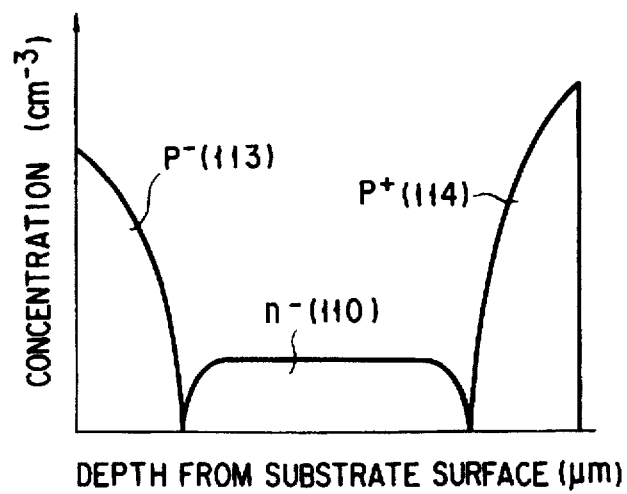
FIG. 2B shows a concentration profile of impurities in the substrate depth direction in a conventional semiconductor device.
Figure 3A:
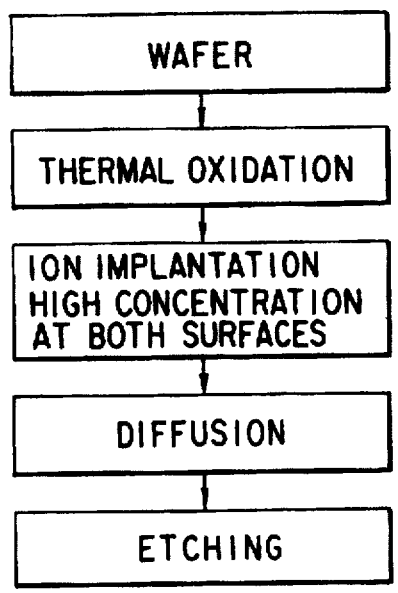
FIG. 3A shows the steps of manufacturing semiconductor devices by a conventional method.
Figure 3B:
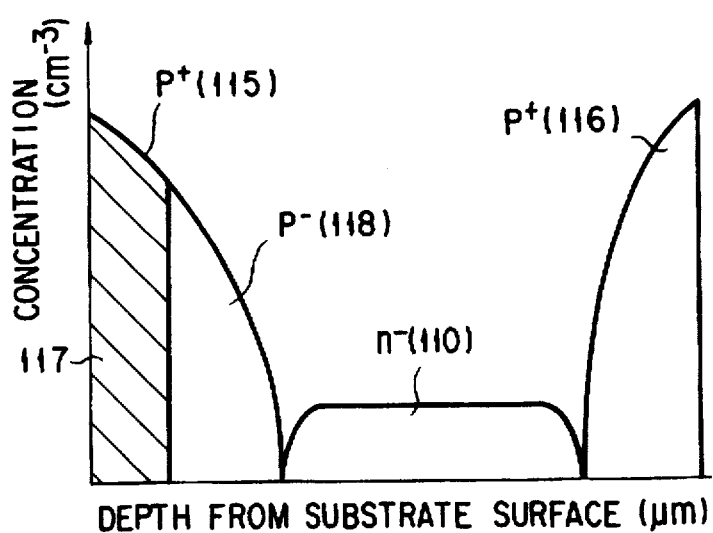
FIG. 3B shows a concentration profile of impurities in the substrate depth direction in a conventional semiconductor device.

FIG. 9 shows the junction leakage current between a low-concentration p-type diffused layer and an n-type silicon substrate 10 in a p-n-p structure produced by the manufacturing method according to the first embodiment. The p-n-p structure manufactured by the manufacturing method of the embodiment presents such a low-leakage current characteristic that the leakage current is as small as 150 μA with an applied voltage of 8 kV. FIG. 9 also shows the leakage characteristic of a p-n-p structure produced by a conventional method (the manufacturing steps shown in FIG. 2A). From the figure, it is understood that the leakage current in the p-n-p structure manufactured by the method of the present invention is decreased remarkably as compared with the leakage current in the p-n-p structure produced by the conventional method.

Furthermore, with the present invention, a sufficient junction breakdown voltage is assured and an increase in the junction leakage current due to recontamination by heavy metal is suppressed, which was not found in the conventional method which needed an additional step of etching away one surface of the substrate to obtain the desired concentration of diffused layers.

Therefore, with the present invention, it is possible to provide a method of manufacturing high-performance, highbreakdown-voltage semiconductor devices which suppresses an increase in the junction leakage current due to heavy metal contamination without increasing the number of steps.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device comprising:

a semiconductor substrate of a first conductivity type;

surface regions of a second conductivity type that are formed by ion-implanting impurities of the second conductivity type into both of the top and bottom surfaces of the substrate and heat-treating the surfaces and that each have a junction formed between an inner portion of the substrate and said surface regions, two in total, wherein one of said two surface regions of the second conductivity type is a first surface region with a high impurity concentration and the other is a second surface region with a low impurity concentration, an entire area of the second surface region including a distortion layer formed by ion-implanting at least one element selected from a group of silicon, carbon, nitrogen, xygen, hydrogen, argon, helium, and xenon; and when the depth of a p-n junction section on the second surface region side from the surface of the second surface region is 10 μm or more, a carrier depletion layer in the p-n junction exists in a portion deeper than the depth of the distortion layer from the surface of the second surface region.

2. A semiconductor device comprising:

a semiconductor substrate of a first conductivity type;

surface regions of a second conductivity type that are formed by ion-implanting impurities of the second conductivity type into both of the top and bottom surfaces of the substrate and heat-treating the surfaces and that each have a junction formed between an inner portion of the substrate and said surface regions, two in total, wherein one of said two surface regions of the second conductivity type is a first surface region with a high impurity concentration and the other is a second surface region with a low impurity concentration, the second surface region including a distortion layer formed by ion-implanting at least one element selected from a group of silicon, carbon, nitrogen, oxygen, hydrogen, argon, helium, and xenon, and when the depth of a p-n junction section on the second surface region side from the surface of the second surface region is less than 10 μm, a high-concentration layer of the second conductivity type is formed locally near the p-n junction section on the second surface region side, and if the depth of the p-n junction section on the second surface region side from the second surface region is $x_j$ and the depth of the end of a carrier depletion layer on the second surface region side from the surface of the second surface region side with a reverse bias being applied to the p-n junction section on the second surface region side is $x_p$, integration of the impurity concentration ranging from $x_p$ to $x_j$ in the second surface region with respect to depth gives a value larger than $2\times10$ cm$^{-2}$.

3. A semiconductor device comprising:

a semiconductor substrate of a first conductivity type;

surface regions of a second conductivity type that are formed by ion-implanting impurities of the second conductivity type into both of the top and bottom surfaces of the substrate and heat-treating the surfaces and that each have a junction formed between the surface regions and an inner portion of the substrate, two in total, wherein the entire areas of said two surface regions of the second conductivity type include distortion layers formed by ion-implanting at least one element selected from a group of silicon, carbon, nitrogen, oxygen, hydrogen, argon, helium, and xenon.

4. A semiconductor device comprising:

a semiconductor substrate of a first conductivity type and having two surfaces;

an epitaxial layer provided on at least one of the surfaces of said substrate;

a first surface region of the second conductivity type formed in one of the surfaces of said substrate by ion-implanting impurities of the second conductivity type into said epitaxial layer and said one of the surfaces of the substrate and heat-treating the epitaxial layer and said one of the surfaces of said substrate;

a second surface region of the second conductivity type formed in the other surface of said substrate by ion-implanting impurities of the second conductivity type into said other surface of said substrate and heat-treating said other surface of said substrate; and two junctions, one formed between one of the surface regions and an inner portion of said substrate and the other formed between the other surface region and the inner portion of said substrate, wherein an entire area of at least one of said first and second surface regions of the second conductivity type includes a distortion layer formed by ion-implanting at least one element selected from a group of silicon, carbon, nitrogen, oxygen, hydrogen, argon, helium and xenon.

* * * * *

UNITED STATES PATENT AND TRADEMARK OFFICE
CERTIFICATE OF CORRECTION

PATENT NO. : 5,731,637
DATED : March 24, 1998
INVENTOR(S) : Shizue Hori et al.

It is certified that error appears in the above-indentified patent and that said Letters Patent is hereby corrected as shown below:

Claim 1, Col. 7, line 30, "xygen" should read --oxygen--.

Signed and Sealed this

Twenty-second Day of June, 1999

Attest:

Q. TODD DICKINSON

Attesting Officer

Acting Commissioner of Patents and Trademarks